US 6,548,912 B1

(12) United States Patent
Graff et al.

(10) Patent No.: US 6,548,912 B1
(45) Date of Patent: Apr. 15, 2003

(54) SEMICODUCTOR PASSIVATION USING BARRIER COATINGS

(75) Inventors: Gordon Lee Graff, West Richland, WA (US); Peter Maclyn Martin, Kennewick, WA (US); Mark Edward Gross, Pasco, WA (US); Ming Kun Shi, Richland, WA (US); Michael Gene Hall, West Richland, WA (US); Eric Sidney Mast, Richland, WA (US)

(73) Assignee: Battelle Memorial Institute, Richland, WA (US)

( * ) Notice: Subject to any disclaimer, the term of this patent is extended or adjusted under 35 U.S.C. 154(b) by 0 days.

(21) Appl. No.: 09/571,649

(22) Filed: May 15, 2000

Related U.S. Application Data

(63) Continuation-in-part of application No. 09/427,138, filed on Oct. 25, 1999.

(51) Int. Cl.[7] .......................... H01L 23/29; H01L 23/48
(52) U.S. Cl. ........................... 257/787; 257/758
(58) Field of Search ............... 257/787, 40, 89, 257/98, 757, 758; 313/506, 512; 361/301.5, 506

(56) References Cited

U.S. PATENT DOCUMENTS

| 3,475,307 A | 10/1969 | Knox et al. |
|---|---|---|
| 3,607,365 A | 9/1971 | Lindlof |
| 4,098,965 A | 7/1978 | Kinsman |
| 4,283,482 A | 8/1981 | Hattori et al. |
| 4,581,337 A | 4/1986 | Frey et al. |
| 4,624,867 A | 11/1986 | Iijima et al. |
| 4,695,618 A | 9/1987 | Mowrer |
| 4,842,893 A | 6/1989 | Yializis et al. |
| 4,954,371 A | 9/1990 | Yializis |

(List continued on next page.)

FOREIGN PATENT DOCUMENTS

| BE | 704 297 | 2/1968 |
|---|---|---|
| EP | 0 299 753 | 1/1989 |
| EP | 0 340 935 | 11/1989 |
| EP | 0 390 540 | 10/1990 |
| EP | 0 547 550 | 6/1993 |
| EP | 0 590 467 | 4/1994 |
| EP | 0 722 787 | 7/1996 |
| EP | 0777 281 | 6/1997 |
| EP | 0 787 826 | 8/1997 |
| EP | 0 916 394 | 5/1999 |
| EP | 0 931 850 | 7/1999 |

(List continued on next page.)

OTHER PUBLICATIONS

Affinito, J.D., et al., "Vacuum Deposition of Polymer Electrolytes On Flexible Substrates", "Proceedings of the Ninth International Conference on Vacuum Web Coating", Nov. 1995 ed R. Bakish, Bakish Press 1995, pp. 20–36.

(List continued on next page.)

*Primary Examiner*—Olik Chaudhuri
*Assistant Examiner*—(Vikki) Hoa B. Trinh
(74) *Attorney, Agent, or Firm*—Killworth, Gottman, Hagan & Schaeff, L.L.P.

(57) ABSTRACT

An encapsulated microelectronic device. The device includes a semiconductor substrate, microelectronic device adjacent to the semiconductor substrate, and at least one first barrier stack adjacent to the microelectronic device. The barrier stack encapsulates the microelectronic device. It includes at least one first barrier layer and at least one first polymer layer. The encapsulated microelectronic device optionally includes at least one second barrier stack located between the semiconductor substrate and the microelectronic device. The second barrier stack includes at least one second barrier layer and at least one second polymer layer. A method for making an encapsulated microelectronic device is also disclosed.

56 Claims, 2 Drawing Sheets

U.S. PATENT DOCUMENTS

| | | | |
|---|---|---|---|
| 5,032,461 | A | 7/1991 | Shaw et al. |
| 5,036,249 | A | 7/1991 | Pike-Biegunski et al. |
| 5,124,204 | A | 6/1992 | Yamashita et al. |
| 5,189,405 | A | 2/1993 | Yamashita et al. |
| 5,237,439 | A | 8/1993 | Misono et al. |
| 5,260,095 | A | 11/1993 | Affinito |
| 5,354,497 | A | 10/1994 | Fukuchi et al. |
| 5,395,644 | A | 3/1995 | Affinito |
| 5,427,638 | A | 6/1995 | Goetz et al. |
| 5,440,446 | A | 8/1995 | Shaw et al. |
| 5,461,545 | A * | 10/1995 | Ieroy et al. ................. 361/765 |
| 5,536,323 | A | 7/1996 | Kirlin et al. |
| 5,547,508 | A | 8/1996 | Affinito |
| 5,554,220 | A | 9/1996 | Forrest et al. |
| 5,576,101 | A | 11/1996 | Saitoh et al. |
| 5,607,789 | A | 3/1997 | Treger et al. |
| 5,620,524 | A | 4/1997 | Fan et al. |
| 5,629,389 | A | 5/1997 | Roitman et al. |
| 5,654,084 | A | 8/1997 | Egert |
| 5,681,615 | A | 10/1997 | Affinito et al. |
| 5,681,666 | A | 10/1997 | Treger et al. |
| 5,684,084 | A | 11/1997 | Lewin et al. |
| 5,686,360 | A | 11/1997 | Harvey, III et al. |
| 5,693,956 | A | 12/1997 | Shi et al. |
| 5,711,816 | A | 1/1998 | Kirlin et al. |
| 5,725,909 | A | 3/1998 | Shaw et al. |
| 5,731,661 | A | 3/1998 | So et al. |
| 5,747,182 | A | 5/1998 | Friend et al. |
| 5,757,126 | A | 5/1998 | Harvey, III et al. |
| 5,759,329 | A | 6/1998 | Krause et al. |
| 5,771,562 | A | 6/1998 | Harvey, III et al. |
| 5,792,550 | A | 8/1998 | Phillips et al. |
| 5,811,177 | A | 9/1998 | Shi et al. |
| 5,811,183 | A | 9/1998 | Shaw et al. |
| 5,821,692 | A | 10/1998 | Rogers et al. |
| 5,844,363 | A | 12/1998 | Gu et al. |
| 5,872,355 | A | 2/1999 | Hueschen |
| 5,902,641 | A | 5/1999 | Affinito et al. |
| 5,902,688 | A | 5/1999 | Antoniadis et al. |
| 5,904,958 | A | 5/1999 | Dick et al. |
| 5,912,069 | A | 6/1999 | Yializis et al. |
| 5,922,161 | A | 7/1999 | Wu et al. |
| 5,945,174 | A | 8/1999 | Shaw et al. |
| 5,948,552 | A | 9/1999 | Antoniadis et al. |
| 5,952,778 | A | 9/1999 | Haskal et al. |
| 5,965,907 | A | 10/1999 | Huang et al. |
| 5,996,498 | A | 12/1999 | Lewis |
| 6,045,864 | A | 4/2000 | Lyons et al. |
| 6,083,698 | A | 7/2000 | Yializis |
| 6,146,225 | A | 11/2000 | Sheats et al. |
| 6,198,204 | B1 | 3/2001 | Suzuki et al. |

FOREIGN PATENT DOCUMENTS

| | | |
|---|---|---|
| EP | 0 977 469 | 2/2000 |
| JP | 63136316 | 6/1988 |
| JP | 64-18441 | 1/1989 |
| JP | 2-183230 | 7/1990 |
| JP | 08325713 | 12/1996 |
| JP | 09059763 | 3/1997 |
| WO | WO 87 07848 | 12/1987 |
| WO | WO 95 10117 | 4/1995 |
| WO | WO 97 04885 | 2/1997 |
| WO | WO 97 22631 | 6/1997 |
| WO | WO 98 10116 | 3/1998 |
| WO | WO 98 18852 | 5/1998 |
| WO | WO 99 16557 | 4/1999 |
| WO | WO 99 16931 | 4/1999 |
| WO | WO 00 26973 | 5/2000 |
| WO | WO 00 36665 | 6/2000 |

OTHER PUBLICATIONS

Vossen, J.L., et al., Thin Film Processes, Academic Press, 1978, Part II, Chapter II–1, Glow Discharge Sputter Depsoition, p. 12–63; Part IV, Chapter IV–1 Plasma Deposition of Inorganic Compounds and Chapter IV–2 Glow Discharge Polymerization, p.335–397.

Penning, F.M., Electrical Discharges In Gasses, Gordon and Breach Science Publishers, 1965, Chapter 5–6, p. 19–35, and Chapter 8, p. 41–50.

Affinito, J.D., et al., "High Rate Vacuum Deposition of Polymer Electrolytes", Journal Vacuum Science Technology A 14(3), May/Jun. 1996.

Inoue et al, Proc. Jpn. Congr. Mater. Res., vol. 33, pp. 177–179, 1990.

Affinito J D et al., "PML/Oxide/PML Barrier Layer Performance Differences Arising From Use Of UV Or Electron Beam Polymerization of the PML Layers" Thin Solid Films, Elsevier Science S.A., vol. 308–309, Oct. 31, 1997, pp. 19–25.

Notification of Transmittal of the International Search Report Or The Declaration, Mar. 3, 2000, PCT/US99/29853.

Gustafsson, G et al., "Flexible light–emitting diodes made from soluble conducting polymers", Nature, vol. 357, Jun. 11, 1992, pp. 447–479.

Affinito, J D et al., "Polymer–Oxide Transparent Barrier Layers", SVC 39th Annual Technical Conference, Vacuum Web Coating Session, 1996, pp. 392–397.

Affinito, J D et al., "PML/Oxide/PML Barrier Layer Performance Differences Arising From Use Of UV Or Electron Beam Polymerization Of The PML Layers", SVC 40th Annual Technical Conference. 1997. pp. 19–25.

Klemberg–Sapieha, J.E. et al., "Transparent Gas Barrier Coatings Produced by Dual–Frequency PECVD" 36th Annual Technical Conference Proceedings, 1993, pp. 445–449.

Krug, T. et al., "New Developments in Transparent Barrier Coatings" 36th Annual Technical Conference Proceedings, 1993, pp. 302–305.

Shaw, D.G. et al., "Use of Vapor Deposited Acrylate Coatings to Improve the Barrier Properties of Metallized Film" 37th Annual Technical Conference Proceedings, 1994, pp. 240–244.

Hoffmann, G. et al. "Transparent Barrier Coatings by Reactive Evaporation" 37th Annual Technical Conference Proceedings, 1994, pp. 155–160.

Kukla, R. et al., "Transparent Barrier Coatings with EB–Evaporation, an Update" Thirteenth International Conference on Vacuum Web Coating, 1999, pp. 223–233.

Hibino, N. et al., "Transparent Barrier A12O3 Coating by Activated Reactive Evaporation" Thirteenth International Conference on Vacuum Web Coating, 1999, pp. 234–246.

Henry, B.M. et al., "Microstructural Studies of Transparent Gas Barrier Coatings on Polymer Substrates" Thirteenth International Conference on Vacuum Web Coatings, 1999, pp. 265–273.

Bright, C. I. et al., Transparent Barrier Coatings Based on ITO for Flexible Plastic Displays, Thirteenth International Conference on Vacuum Web Coating, 1999, pp. 247–255.

Finson E. et al., "Transparent SiO2 Barrier Coatings: Conversion and Production Status" 37th Annual Technical Conference Proceedings, 1994, pp. 139–143.

Yializis, A., "High Oxygen Barrier Polypropylene Films Using Transparent Acrylate–A203 and Opaque Al–Acrylate Coatings" 38th Annual Technical Conference Proceedings, 1995, pp. 95–102.

Yamada, Y. et al., "The Properties of a New Transparent and Colorless Barrier Film" 38th Annual Technical Conference Proceedings, 1995, pp. 28–31.

Chahroudi, D., "Transparent Glass Barrier Coatings for Flexible Film Packaging" 34th Annual Technical Conference Proceedings, 1991, pp. 130–133.

Yializis A. et al., "Ultra High Barrier Films" 43rd Annual Technical Conference Proceedings, Denver, Apr. 15–20, 2000, pp. 404–407.

Felts, J.T., "Transparent Barrier Coatings Update: Flexible Substrates" 36th Annual Technical Conference Proceedings, 1993, pp. 324–331.

Norenberg H. et al., "Comparative Study of Oxygen Permeation Through Polymers and Gas Barrier Films" 43rd Annual Technical Conference Proceedings, Denver, Apr. 15–20, 2000, pp. 347–351.

Henry, B.M. et al., "Microstructural and Gas Barrier Properties of Transparent Aluminum Oxide and Indium Tin Oxide Films" 43rd Annual Technical Conference Proceedings, Denver, Apr. 15–20, 2000, pp. 373–378.

Phillips, R.W. et al., "Evaporated Dielectric Colorless Films on PET and OPP Exhibiting High Barriers Toward Moisture and Oxygen" 36th Annual Technical Conference Proceedings, 1993, pp. 293–301.

Mahon J.K. et al,. "Requirements of Flexible Substrates for Organic Light Emitting Devices in Flat Panel Display Applications" 42nd Annual Technical Conference Proceedings, 1999, pp. 456–459.

\* cited by examiner

SEMICODUCTOR PASSIVATION USING BARRIER COATINGS

This application is a continuation-in-part of U.S. patent application Ser. No. 09/427138, filed Oct. 25, 1999, entitled "Environmental Barrier Material For Organic Light Emitting Device And Method Of Making."

BACKGROUND OF THE INVENTION

The present invention relates generally to microelectronic devices, and more particularly to microelectronic devices encapsulated in barrier stacks.

Microelectronic devices fabricated on semiconductor substrates require passivation, or encapsulation, to protect them from atmospheric contaminants and constituents, mechanical damage, stress, thermal stress and cycling, downstream processing, and corrosive chemicals.

Passivation of the microelectronic devices performs several functions. First, it electrically insulates the microelectronic device from other microelectronic devices. It preserves the recombination velocity at the semiconductor surface. It is also a stress buffer to minimize cracking. It provides protection from processing chemicals, ultraviolet light exposure, and photoresists during lithography processes. In addition, it provides protection from humidity, oxidants, corrosive materials, scratching, and mechanical damage. Finally, it provides gettering of mobile ions, such as $Cl^-$, and $Na^+$. Lavinger et al., J. Vac. Sci. Technol. A16(2), Mar./Apr. 1998, p.530.

Conventional hermetic sealing in metal or ceramic provides effective protection. However, conventional hermetic enclosures are relatively bulky (about 4–6 mm deep), and they add a significant amount of weight to the product, which reduces the benefits of miniaturization.

Many devices that require passivation are now fabricated on glass, fused silica, and ceramic substrates. For example, thin films of amorphous silicon nitride ($Si_3N_4$) and silicon dioxide ($SiO_2$) are used on p-type semiconductor devices as a protective coating, a mask for lithography processes, charge storage systems in nonvolatile metal-nitride-oxide-semiconductor memory devices, insulators between metal layers, gate insulators for thin film transistors, and ultrathin dielectrics for very large scale integration devices. For integrated circuit applications, $SiO_2$ is the stress buffer layer and $Si_3N_4$ is the passivation layer, as described in U.S. Pat. No. 5,851,603, which is incorporated herein by reference. Silicon nitride is primarily deposited by chemical vapor deposition processes (CVD), such as atmospheric pressure chemical vapor deposition (APCVD), low pressure chemical vapor deposition (LPCVD), and plasma enhanced chemical vapor deposition (PECVD). However, the use of inorganic materials deposited by standard semiconductor processes such as chemical vapor deposition has several disadvantages. The most serious disadvantages are brittleness, a tendency to crack under mechanical stress, poor step coverage, poor planarization properties, and poor barrier properties. The best oxygen permeation rate for $Si_3N_4$ deposited by electron cyclotron resonance-plasma enhanced vapor deposition (ECR PECVD) is reported to be near 1 $cc/m^2/day$. The best oxygen permeation rate for $SiO_2$ is also near 1 $cc/m^2/day$.

As a result of these problems, there has been a significant effort to replace inorganic materials such as $SiO_2$ and $Si_3N_4$ with polymer dielectrics. Polymer materials of interest include polyimide, polyamide, and paralyene. Organic materials offer good adhesion, sufficient elasticity, and sufficient tensile strength. However, these materials have problems with brittleness and defects such as voids. C. P. Wong, Ceramic Trans. 33, 1993 p. 125.

The barrier protection offered by inorganic and organic materials is not usually adequate to ensure reliable microelectronic device operation. Additional barrier layers are added prior to encapsulation. Materials such as silicon rubber are used as barriers. The integrated circuit can be embedded in plastic by injection molding to add further moisture barrier protection.

Epoxies are also used for barrier applications and encapsulation. The epoxy layers used for encapsulation are only about one quarter of the thickness of the layers required for convention hermetic sealing. However, even that thickness produces a device which is unacceptably heavy and bulky in many applications. In addition, epoxies have a water vapor permeation rate which is too high for some applications.

The passivation layers currently being used in microelectronics include silicon dioxide, silicon nitride, and silicon oxynitride layers with thicknesses up to about 1 $\mu$m. These layers are deposited by CVD and reactive magnetron sputtering processes, which can require substrate and processing temperatures as high as 800° C. Materials deposited by CVD can also have very stresses (i.e., greater than 10,000 MPa).

The inorganic layer is often followed by a spin cast polyimide layer about 0.5 $\mu$m thick. The polyimide layer is used for passivation, encapsulation, planarization, and bonding/molding to the packaging. The layer is spun on and cured at temperatures up to 250° C. The oxygen and water vapor barrier properties of polyimide are poor and typical of polymer substrates (>10 $cc/m^2/day$). Polyimide is very opaque and strongly absorbing at visible wavelengths. Polyimide films can have large numbers of voids, which can cause reliability problems with integrated circuits. The voids can also cause hot spots and cracks that can damage integrated circuit components.

Another method used to protect microelectronic circuitry is vapor deposition of a thin film of parylene. However, the water vapor permeation rate of the parylene is too high for many applications. In addition, parylene is subject to thermal oxidation at temperatures over about 120° C.

Furthermore, PECVD coatings have problems with pinholes, poor step coverage, and particulates. The quality of the coating is usually poor. Deposition processes for these layers can damage temperature sensitive material in, for example, integrated circuits, organic light emitting devices, light emitting polymers and microlasers. As a result, totally effective encapsulation of temperature sensitive devices cannot be achieved on semiconductor substrates using conventional deposition processes. Additionally, in order to obtain the required encapsulation and passivation, the current passivation layers must be thick compared to device thicknesses and sizes, which causes problems in the fabrication of multilevel integrated circuits. Finally, as discussed above, the barrier properties for these materials are inadequate for many applications.

Thus, there is a need for an improved, lightweight, thin film, barrier construction which can be used to encapsulate microelectronic devices, and for methods for making such encapsulated microelectronic devices.

SUMMARY OF THE INVENTION

The present invention meets these needs by providing an encapsulated microelectronic device and a method for making such a device. The device includes a semiconductor substrate, a microelectronic device adjacent to the semiconductor substrate, and at least one first barrier stack adjacent to the microelectronic device. By adjacent, we mean next to, but not necessarily directly next to. There can be additional intervening layers. The barrier stack encapsulates the microelectronic device. It includes at least one first barrier layer and at least one first polymer layer. The encapsulated microelectronic device optionally includes at least one second barrier stack located between the semiconductor substrate and the microelectronic device. The second barrier stack includes at least one second barrier layer and at least one second polymer layer.

Preferably, either one or both of the first and second barrier layers of the first and second barrier stacks is substantially transparent. At least one of the first barrier layers preferably comprises a material selected from metal oxides, metal nitrides, metal carbides, metal oxynitrides, metal oxyborides, and combinations thereof.

Either one of the first and second barrier layers can be substantially opaque, if desired. The opaque barrier layers are preferably selected from opaque metals, opaque polymers, opaque ceramics, and opaque cermets.

The polymer layers of the first and second barrier stacks are preferably acrylate-containing polymers. As used herein, the term acrylate-containing polymers includes acrylate-containing polymers, methacrylate-containing polymers, and combinations thereof The polymer layers in the first and/or the second barrier stacks can be the same or different.

The semiconductor substrate can either be flexible or rigid.

The microelectronic device is preferably selected from integrated circuits, charge coupled devices, light emitting diodes, light emitting polymers, organic light emitting devices, metal sensor pads, micro-disk lasers, electrochromic devices, photochromic devices, microelectromechanical systems, and solar cells.

The encapsulated microelectronic device can include additional layers if desired, such as polymer smoothing layers, scratch resistant layers, or other functional layers. The encapsulated microelectronic device can also include a lid adjacent to the at least one first barrier stack.

The present invention also involves a method of making the encapsulated microelectronic device. The method includes providing a semiconductor substrate having an microelectronic device thereon, and placing at least one first barrier stack over the microelectronic device to encapsulate the microelectronic device. The barrier stack includes at least one first barrier layer and at least one first polymer layer.

The microelectronic device can be placed on the semiconductor substrate by diffusion, ion implantation on deposition, or lamination. The at least one first barrier stack can be placed over the microelectronic device by deposition, preferably vacuum deposition, or by laminating the barrier stack over the environmentally sensitive device. The lamination can be performed using an adhesive, solder, ultrasonic welding, pressure, or heat.

A second barrier stack can be placed on the semiconductor substrate before the microelectronic device is placed there. The second barrier stack includes at least one second barrier layer and at least one second polymer layer. The second barrier stack can be deposited on the semiconductor substrate, preferably by vacuum deposition.

The semiconductor substrate can be removed from the encapsulated microelectronic device, if desired.

Accordingly, it is an object of the present invention to provide an encapsulated microelectronic device, and to provide a method of making such as device.

DESCRIPTION OF THE INVENTION

Figure 1:
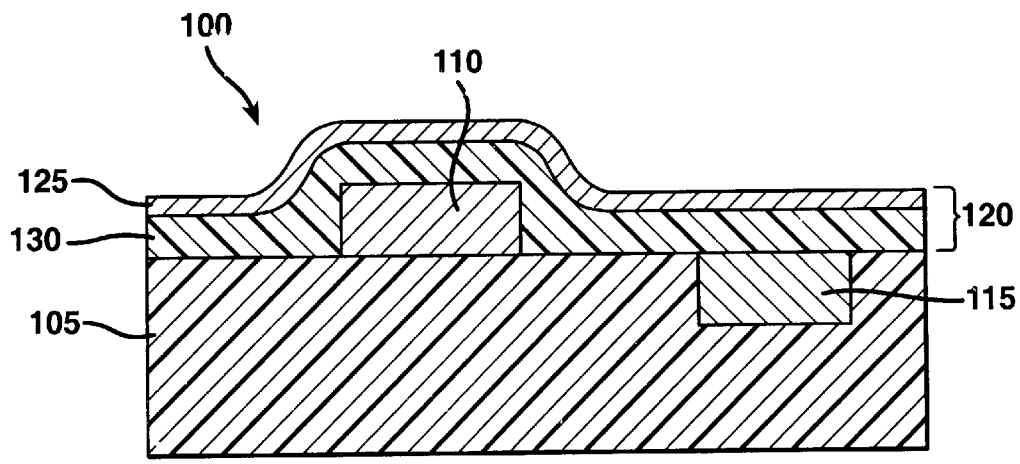
FIG. 1 is a cross-section of one embodiment of the encapsulated microelectronic device of the present invention.

One embodiment of the encapsulated microelectronic device of the present invention is shown in FIG. 1. The encapsulated microelectronic device 100 includes a semiconductor substrate 105, microelectronic devices 110 and 115, and a first barrier stack 120. Microelectronic device 115 is embedded in semiconductor substrate 105. Microelectronic device 110 is placed on the semiconductor substrate 105. The first barrier stack 120 includes at least one first barrier layer 125 and at least one first polymer layer 130. The first barrier stack 120 encapsulates and passivates the microelectronic devices 110 and 115.

The semiconductor substrate 105 can be either rigid or flexible.

Examples of microelectronic devices 110 and 115 include, but are not limited to, integrated circuits, charge coupled devices, light emitting diodes, light emitting polymers, organic light emitting devices, metal sensor pads, micro-disk lasers, electrochromic devices, photochromic devices, microelectromechanical systems and solar cells. These microelectronic devices can be made using known techniques, such as those described in U.S. Pat. Nos. 6,043,523 and 6,030,852 (charged couple devices); U.S. Pat. Nos. 6,040,588 and 6,067,188 (LEDs); U.S. Pat. Nos. 6,023,373, 6,023,124, 6,023,125 (LEPs); U.S. Pat. Nos. 5,629,389, 5,747,182, 5,844,363, 5,872,355, 5,902,688, and 5,948,552 (OLEDs); Martin, et al.; Fabrication of Plastic Microfluidic Components, SPIE Proceedings 3515, 1998, 177; Matson, et al., Fabrication Processes for Polyrner-Based Microfluidic Analytical Devices, Proceedings of $\mu$-TAS '98, 1998, (metal sensor pads), U.S. Pat. Nos. 5,825,799 and 5,790,582 (micro-disk lasers); U.S. Pat. Nos. 5,995,273, 5,888,431, and 4,253,741 (electrochromic devices); U.S. Pat. Nos. 4,838,483 and 5,604,626 (photochromic devices); U.S. Pat. Nos. 5,761,350 and 6,046,066 (microelectromechanical systems); and M. Sittig, Solar Cells for Photovoltaic Generation of Electricity, Energy Technology Review, No. 48, Noyes Data Corp. N.Y. 1979 (solar cells) which are incorporated herein by reference.

In each barrier stack 120, there can be one or more barrier layers 125 and one or more polymer layers 130. The barrier layers and polymer layers in the barrier stack can be made of the same material or of a different material. The barrier layers are typically about 100-400 Å thick, and the polymer layers are typically about 1000-10,000 Å thick.

Although FIG. 1 shows a barrier stack with a single barrier layer and a single polymer layer, the barrier stacks can have one or more polymer layers and one or more barrier layers. There could be one polymer layer and one barrier layer, there could be one or more polymer layers on one side of one or more barrier layers, or there could be one or more polymer layers on both sides of one or more barrier layers. The important feature is that the barrier stack have at least one polymer layer and at least one barrier layer.

There can be additional overcoat layers on top of the barrier stack, such as organic or inorganic layers, planarizing layers, transparent conductors, antireflective coatings, or other functional layers, if desired.

Optionally, the semiconductor substrate can be placed on a plastic substrate. In this case, a barrier stack is preferably placed on the plastic substrate before the semiconductor substrate is placed thereon.

Figure 2:
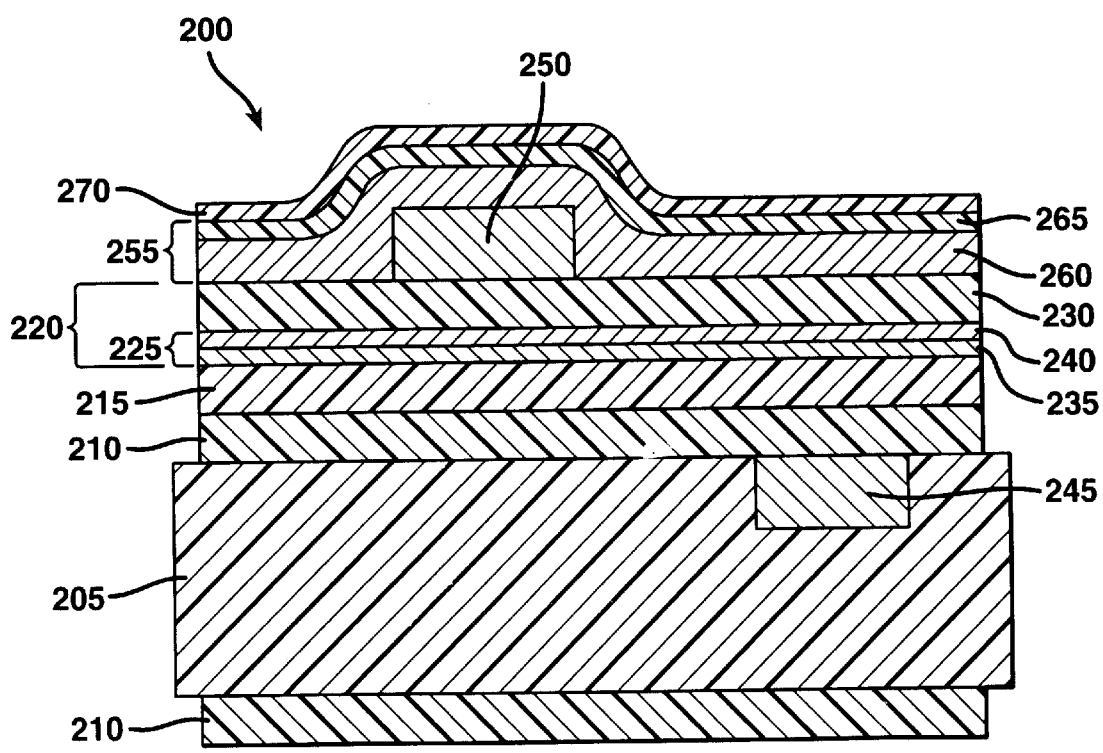
FIG. 2 is a cross-section of a second embodiment of the encapsulated microelectronic device of the present invention.

A second embodiment of the encapsulated microelectronic device of the present invention is shown in FIG. 2. The encapsulated microelectronic device 200 has a semiconductor substrate 205. There are scratch resistant layers 210 on either side of the semiconductor substrate 205 to protect it. When a scratch resistant layer is included, it is preferred that both sides of the semiconductor substrate have a scratch resistant layer. This helps to prevent curling of a flexible semiconductor substrate.

On top of the scratch resistant layer 210, there is a polymer smoothing layer 215. The polymer smoothing layer, decreases surface roughness, and encapsulates surface defects, such as pits, scratches, and digs. This produces a planarized surface which is ideal for deposition of subsequent layers. Depending on the desired application, there can be additional layers deposited on the semiconductor substrate 205, such as organic or inorganic layers, planarizing layers, electrode layers, antireflective coatings and other functional layers. In this way, the semiconductor substrate can be specifically tailored to different applications.

The first barrier stack 220 is above the polymer smoothing layer 215. The first barrier stack 220 includes a first barrier layer 225 and a first polymer layer 230. The first barrier layer 225 includes barrier layers 235 and 240. Barrier layers 235 and 240 can be made of the same barrier material or of different barrier materials.

There are microelectronic devices 245 and 250. Microelectronic device 245 is embedded in substrate 205. Microelectronic device 250 is placed over the first barrier stack 220. There is a second barrier stack 255 placed over the microelectronic device 250 to encapsulate it. The second barrier stack 255 has a barrier layer 260 and a polymer layer 265, although it can have one or more barrier layers and one or more polymer layers, as discussed above. The barrier layers and polymer layers in the first and second barrier stacks can be the same or they can be different.

Although only one first barrier stack and only one second barrier stack are shown in FIG. 2, the number of barrier stacks is not limited. The number of barrier stacks needed depends on the semiconductor substrate material used and the level of water vapor and oxygen permeation resistance needed for the particular application. One or two barrier stacks should provide sufficient barrier properties for some applications. The most stringent applications may require five or more barrier stacks.

There is a lid 270 over the second barrier stack 255. The lid can be can be either rigid or flexible. A flexible lid can be made of any flexible material including, but not limited to: polymers, for example, polyethylene terephthalate (PET), polyethylene naphthalate (PEN), or high temperature polymers such as polyether sulfone (PES), polyimides, or Transphan™ (a high glass transition temperature cyclic olefin polymer available from Lofo High Tech Film, GMBH of Weil am Rhein, Germany); metal; paper; fabric; and combinations thereof. Rigid lids are preferably made of glass, metal, or semiconductors.

Figure 3:
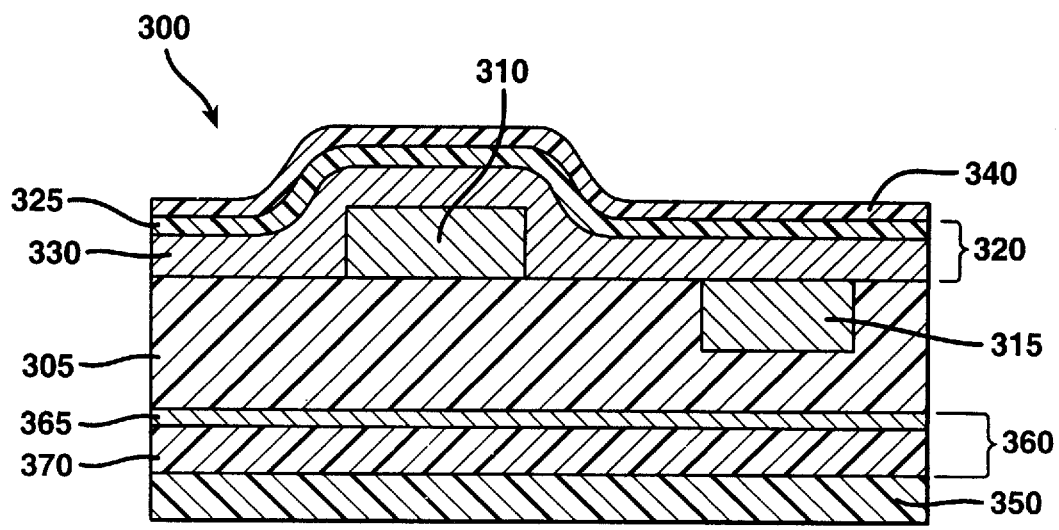
FIG. 3 is a cross-section of a third embodiment of the encapsulated microelectronic device of the present invention.

A third embodiment is shown in FIG. 3. The encapsulated microelectronic device 300 includes a semiconductor substrate 305, microelectronic devices 310 and 315, and a first barrier stack 320. Microelectronic device 315 is embedded in semiconductor substrate 305, and microelectronic device 310 is placed adjacent to the semiconductor substrate 305. The first barrier stack 320 includes at least one first barrier layer 325 and at least one polymer layer 330. The first barrier stack 320 encapsulates and passivates the microelectronic devices 310 and 315. There is at least one overcoat layer 340 on top of the first barrier stack 320. Overcoat layers include organic layers, inorganic layers, planarizing layers, transparent conductors, antireflective coatings, or other functional layers. The semiconductor substrate 305 is adjacent to a plastic substrate 350. There is a third barrier stack 360 between the plastic substrate 350 and the semiconductor substrate 305. The third barrier stack 360 has a third barrier layer 365 and a third polymer layer 370.

The method of making the encapsulated microelectronic device will be described with reference to the embodiment shown in FIG. 2. A microelectronic device can be embedded in the semiconductor substrate by diffusion and ion implantation. Any initial layers which are desired, such as scratch resistant layers, planarizing layers, electrically conductive layers, etc., can be coated, deposited, or otherwise placed on the semiconductor substrate. A polymer smoothing layer is preferably included to provide a smooth base for the remaining layers. It can be formed by depositing a layer of polymer, for example, an acrylate-containing polymer, onto the semiconductor substrate or previous layer. The polymer layer can be deposited in vacuum or by using atmospheric processes such as spin coating and/or spraying. Preferably, an acrylate-containing monomer, oligomer, or resin is deposited and then polymerized in situ to form the polymer layer. As used herein, the term acrylate-containing monomer, oligomer, or resin includes acrylate-containing monomers, oligomers, and resins, methacrylate-containing monomers, oligomers, and resins, and combinations thereof.

The first barrier stack is then placed on the semiconductor substrate. The first and second barrier stacks include at least one barrier layer and at least one polymer layer. The barrier stacks are preferably made by vacuum deposition. The barrier layer can be vacuum deposited onto the polymer smoothing layer, semiconductor substrate, or previous layer. The polymer layer is then deposited on the barrier layer, preferably by flash evaporating acrylate-containing monomers, oligomers, or resins, condensing on the barrier layer, and polymerizing in situ in a vacuum chamber. U.S. Pat. Nos. 5,440,446 and 5,725,909, which are incorporated herein by reference, describe methods of depositing thin film, barrier stacks.

Vacuum deposition includes flash evaporation of acrylate-containing monomer, oligomer, or resin with in situ polymerization under vacuum, plasma deposition and polymerization of acrylate-containing monomer, oligomer, or resin, as well as vacuum deposition of the barrier layers by sputtering, chemical vapor deposition, plasma enhanced chemical vapor deposition, evaporation, sublimation, electron cyclotron resonance-plasma enhanced vapor deposition (ECR-PECVD), and combinations thereof.

In order to protect the integrity of the barrier layer, the formation of defects and/or microcracks in the deposited layer subsequent to deposition and prior to downstream processing should be avoided. The encapsulated microelectronic device is preferably manufactured so that the barrier layers are not directly contacted by any equipment, such as rollers in a web coating system, to avoid defects that may be caused by abrasion over a roll or roller. This can be accomplished by designing the deposition system such that the barrier layers are always covered by polymer layers prior to contacting or touching any handling equipment.

Another microelectronic device is then placed on the first barrier layer. The microelectronic device can be placed on the semiconductor substrate by deposition, diffusion, ion implantation, or lamination. The deposition can be vacuum deposition. The lamination can use an adhesive, such as glue, or the like, solder, ultrasonic welding, pressure, or heat to seal the microelectronic device to the semiconductor substrate.

The second barrier stack is then placed over the microelectronic device to encapsulate it. The second barrier stack can be placed over the microelectronic device by deposition or lamination.

The barrier layers in the first and second barrier stacks may be any barrier material. The barrier layers in the first and second barrier stacks can be made of the same material or a different material. In addition, multiple barrier layers of the same or different barrier materials can be used in a barrier stack.

The barrier layers can be transparent or opaque, depending on the design and application of the microelectronic device. Preferred transparent barrier materials include, but are not limited to, metal oxides, metal nitrides, metal carbides, metal oxynitrides, metal oxyborides, and combinations thereof. The metal oxides are preferably selected from silicon oxide, aluminum oxide, titanium oxide, indium oxide, tin oxide, indium tin oxide, tantalum oxide, zirconium oxide, niobium oxide, and combinations thereof. The metal nitrides are preferably selected from aluminum nitride, silicon nitride, boron nitride, and combinations thereof. The metal oxynitrides are preferably selected from aluminum oxynitride, silicon oxynitride, boron oxynitride, and combinations thereof.

Opaque barrier layers can be used in some barrier stacks depending on the design of the microelectronic device. Opaque barrier materials include, but are not limited to, metals, ceramics, polymers, or cernets. Examples of opaque cermets include, but are not limited to, zirconium nitride, titanium nitride, hafnium nitride, tantalum nitride, niobium nitride, tungsten disilicide, titanium diboride, and zirconium diboride.

The polymer layers of the first and second barrier stacks are preferably acrylate-containing monomers, oligomers, or resins. The polymer layers in the first and second barrier stacks can be the same or different. In addition, the polymer layers within each barrier stack can be the same or different.

Because the encapsulation/barrier stacks can be transparent layers with different dielectric constants, refractive index, and extinction coefficients, optical interference in the layers can be employed to add functionality to the coating. By adjusting layer thicknesses, the coating can be designed to perfonn antireflection, bandpass, notch filter, dichroic, and high reflection functions, thus controlling the light intensity and wavelengths into and out of the device. This can be useful for optical sensor devices such as organic light emitting devices, microlasers, light emitting polymers, and light emitting diodes.

In a preferred embodiment, the barrier stack includes a polymer layer and two barrier layers. The two barrier layers can be made from the same barrier material or from different barrier materials. The thickness of each barrier layer in this embodiment is about one half the thickness of the single barrier layer, or about 100 to 150 Å. There are no limitations on the thickness, however.

When the barrier layers are made of the same material, they can be deposited either by sequential deposition using two sources or by the same source using two passes. If two deposition sources are used, deposition conditions can be different for each source, leading to differences in microstructure and defect dimensions. Any type of deposition source can be used. Different types of deposition processes, such as magnetron sputtering and electron beam evaporation, can be used to deposit the two barrier layers.

The microstructures of the two barrier layers are mismatched as a result of the differing deposition sources/parameters. The barrier layers can even have different crystal structure. For example, $Al_2O_3$ can exist in different phases (alpha, gamma) with different crystal orientations. The mismatched microstructure can help decouple defects in the adjacent barrier layers, enhancing the tortuous path for gases and water vapor permeation.

When the barrier layers are made of different materials, two deposition sources are needed. This can be accomplished by a variety of techniques. For example, if the materials are deposited by sputtering, sputtering targets of different compositions could be used to obtain thin films of different compositions. Alternatively, two sputtering targets of the same composition could be used but with different reactive gases. Two different types of deposition sources could also be used. In this arrangement, the lattices of the two layers are even more mismatched by the different microstructures and lattice parameters of the two materials.

A single pass, roll-to-roll, vacuum deposition of a three layer combination on a PET substrate, i.e., PET substrate/polymer layer/barrier layer/polymer layer, can be more than five orders of magnitude less permeable to oxygen and water vapor than a single oxide layer on PET. alone. See J. D. Affinity, M. E. Gross, C. A. Coronado, G. L. Graff, EN Greenwell, and P. M. Martin, *Polymer-Oxide Transparent Barrier Layers Produced Using PAL Process,* $39^{th}$ Annual Technical Conference Proceedings of the Society of Vacuum Caters, Vacuum Web Coating Session, 1996, pages 392-397; J. D. Affinito, S. Eufinger, M. E. Gross, G. L. Graff, and P. M. Martin, *PAL/Oxide/PAL Barrier Layer Performance Differences Arising From Use of UV or Electron Beam Polymerization of the PAL Layers,* Thin Solid Films, Vol. 308, 1997, pages 19–25. This is in spite of the fact that the effect on the permeation rate of the polymer multilayers (PAL) layers alone, without the barrier layer (oxide, metal, nitride, oxynitride) layer, is barely measurable. It is believed that the improvement in barrier properties is due to two factors. First, permeation rates in the roll-to-roll coated oxide-only layers were found to be conductance limited by defects in the oxide layer that arose during deposition and when the coated substrate was wound up over system idlers/rollers. Asperities (high points) in the underlying substrate are replicated in the deposited inorganic barrier layer. These features are subject to mechanical damage during web handling/take-up, and can lead to the formation of defects in the deposited film. These defects seriously limit the ultimate barrier performance of the films. In the single pass, polymer/barrier/polymer process, the first acrylic layer planarizes the substrate and provides an ideal surface for subsequent deposition of the inorganic barrier thin film. The second polymer layer provides a robust "protective" film that minimizes damage to the barrier layer and also planarizes the structure for subsequent barrier layer (or microelectronic device) deposition. The intermediate polymer layers also decouple defects that exist in adjacent inorganic barrier layers, thus creating a tortuous path for gas diffusion.

The permeability of the barrier stacks used in the present invention is shown in Table 1. The barrier stacks of the present invention on polymeric substrates, such as PET, have measured oxygen transmission rates (OTR) and water vapor transmission rates (WVTR) values well below the detection limits of current industrial instrumentation used for permeation measurements (Mocon OxTran 2/20L and Permatran). Table 1 shows the OTR and WVTR values (measured according to ASTM F 1927–98 and ASTM 1249–90, respectively) measured at Mocon (Minneapolis, Minn.) for several barrier stacks on 7 mil PET along with reported values for other materials.

TABLE 1

| Sample | Oxygen Permeation Rate ($cc/m^2/day$) | | Water Vapor Permeation ($g/m^2/day$)[+] | |
|---|---|---|---|---|
| | 23° C. | 38° C. | 23° C. | 38° C. |
| Native 7 mil PET | 7.62 | — | — | — |
| 1-barrier stack | <0.005 | <0.005* | — | 0.46[+] |
| 1-barrier stack with ITO | <0.005 | <0.005* | — | 0.011[+] |
| 2-barrier stacks | <0.005 | <0.005* | — | <0.005[+] |
| 2-barrier stacks with ITO | <0.005 | <0.005* | — | <0.005[+] |
| 5-barrier stacks | <0.005 | <0.005* | — | <0.005[+] |
| 5-barrier stacks with ITO | <0.005 | <0.005* | — | <0.005[+] |
| DuPont film[1] ($PET/Si_3N_4$ or $PEN/Si_3N_4$) | 0.3 | — | — | — |
| Polaroid film[1] | <1.0 | — | — | — |
| PET/Al[2] | 0.6 | — | 0.17 | — |
| PET/silicon oxide[2] | 0.7–1.5 | — | 0.15–0.9 | — |
| Teijin LCD film (HA grade - TN/STN)[3] | <2 | — | <5 | — |

*38° C., 90% RH, 100% $O_2$
[+]38° C. 100% RH
1-P.F. Carcia, 46th International Symposium of the American Vacuum Society, Oct. 1999
2-Langowski, H.C., 39th Annual Technical Conference Proceedings, SVC, pp. 398–401 (1996)
3-Technical Data Sheets As the data in Table 1 shows, the barrier stacks of the present invention provide oxygen and water vapor permeation rates several orders of magnitude better than PET coated with aluminum, silicon oxide, or aluminum oxide. The barrier stacks are extremely effective in preventing oxygen and water penetration to the underlying components, substantially outperforming other barrier coatings on the market. The barrier stacks have an oxygen transmission rate of less than 0.005 $cc/m^2/day$ at 23° C. and 0% relative humidity, an oxygen transmission rate of less than 0.005 $cc/m^2/day$ at 38° C. and 90% relative humidity, and a water vapor transmission rate of less than 0.005 $g/m^2/day$ at 38° C. and 100% relative humidity. The actual transmission rates of the barrier stacks is less than this, but it cannot be measured with existing equipment.

Semiconductor passivation is compatible with flexible and rigid semiconductor substrates. The barrier stacks can be deposited in a batch, in-line or cluster tool, or on thin film transistors deposited on flexible substrates, such as metal foils and polymeric webs. The encapsulation/barrier stack deposition process is compatible with integrated circuit fabrication processes and does not damage sensitive microcircuitry and active devices. The barrier stacks can be deposited over nonuniform surfaces and can effectively encapsulate and planarize surface features.

Because the preferred process involves flash evaporation of a monomer and magnetron sputtering, deposition temperatures are below 100° C., which is much less than the 300° C. to 800° C. temperatures required for CVD coating processes, and stresses in the coating can be minimized. Because of the low temperatures, the process does not harm or degrade temperature sensitive components. Multilayer coatings can be deposited at high deposition rates. No harsh gases or chemicals are used, and the process can be scaled up to large substrates and wide webs. The barrier properties of the coating can be tailored to the application by controlling the number of layers, the materials, and the layer design.

The encapsulation process of the present invention provides improved encapsulation of microelectronic devices on semiconductor substrates. In addition to the improved barrier properties, the chemical resistance, thermal and shock resistance, mechanical robustness, and coating quality are also improved. As a result, the lifetime of the encapsulated microelectronic devices is significantly increased.

Thus, the present invention provides a barrier stack with the exceptional barrier and other properties necessary for hermetic sealing of an microelectronic device.

While certain representative embodiments and details have been shown for purposes of illustrating the invention, it will be apparent to those skilled in the art that various changes in the compositions and methods disclosed herein may be made without departing from the scope of the invention, which is defined in the appended claims.

What is claimed is:

1. An encapsulated microelectronic device comprising:
   a semiconductor substrate;
   a microelectronic device adjacent to the semiconductor substrate, the microelectronic device being selected from integrated circuits, charge coupled devices, metal sensor pads, micro-disk lasers, electrochromic devices, photochromic devices, microelectromechanical systems and solar cells; and
   at least one first barrier stack comprising at least one first barrier layer and at least one first polymer layer, the at least one first barrier stack adjacent to the microelectronic device on a side opposite the semiconductor substrate, wherein the at least one first barrier stack encapsulates the microelectronic device.

2. The encapsulated microelectronic device of claim 1 further comprising at least one second barrier stack located between the semiconductor substrate and the microelectronic device, the at least one second barrier stack comprising at least one second barrier layer and at least one second polymer layer.

3. The encapsulated microelectronic device of claim 1 wherein the at least one first barrier layer is substantially transparent.

4. The encapsulated microelectronic device of claim 2 wherein the at least one second barrier layer is substantially transparent.

5. The encapsulated microelectronic device of claim 1 wherein at least one of the at least one first barrier layers comprises a material selected from metal oxides, metal nitrides, metal carbides, metal oxynitrides, metal oxyborides, and combinations thereof.

6. The encapsulated microelectronic device of claim 5 wherein the metal oxides are selected from silicon oxide, aluminum oxide, titanium oxide, indium oxide, tin oxide, indium tin oxide, tantalum oxide, zirconium oxide, niobium oxide, and combinations thereof.

7. The encapsulated microelectronic device of claim 5 wherein the metal nitrides are selected from aluminum nitride, silicon nitride, boron nitride, and combinations thereof.

8. The encapsulated microelectronic device of claim 5 wherein the metal oxynitrides are selected from aluminum oxynitride, silicon oxynitride, boron oxynitride, and combinations thereof.

9. The encapsulated microelectronic device of claim 1 wherein the at least one first barrier layer is substantially opaque.

10. The encapsulated microelectronic device of claim 2 wherein the at least one second barrier layer is substantially opaque.

11. The encapsulated microelectronic device of claim 1 wherein at least one of the at least one first barrier layers is selected from opaque metals, opaque polymers, opaque ceramics, and opaque cermets.

12. The encapsulated microelectronic device of claim 2 wherein at least one of the at least one second barrier layers is selected from opaque metals, opaque polymers, opaque ceramics, and opaque cermets.

13. The encapsulated microelectronic device of claim 1 wherein the semiconductor substrate comprises a flexible semiconductor substrate material.

14. The encapsulated microelectronic device of claim 1 wherein the semiconductor substrate comprises a rigid semiconductor substrate material.

15. The encapsulated microelectronic device of claim 1 wherein at least one of the at least one first polymer layers comprises an acrylate-containing polymer.

16. The encapsulated microelectronic device of claim 2 wherein at least one of the at least one second polymer layers comprises an acrylate-containing polymer.

17. The encapsulated microelectronic device of claim 1 further comprising a polymer smoothing layer adjacent to the semiconductor substrate.

18. The encapsulated microelectronic device of claim 1 further comprising a scratch resistant layer adjacent to the semiconductor substrate.

19. The encapsulated microelectronic device of claim 1 further comprising an antireflective coating.

20. The encapsulated microelectronic device of claim 1 further comprising an antifingerprint coating.

21. The encapsulated microelectronic device of claim 1 further comprising an antistatic coating.

22. The encapsulated microelectronic device of claim 1 wherein the at least one first barrier layer comprises two barrier layers.

23. The encapsulated microelectronic device of claim 22 wherein the two barrier layers are made of the same barrier material.

24. The encapsulated microelectronic device of claim 22 wherein the two barrier layers are made of different barrier materials.

25. The encapsulated microelectronic device of claim 1 wherein the oxygen transmission rate through the at least one first barrier stack is less than 0.005 cc/m$^2$/day at 23° C. and 0% relative humidity.

26. The encapsulated microelectronic device of claim 1 wherein the water vapor transmission rate through the at least one first barrier stack is less than 0.005 gm/m$^2$/day at 38° C. and 100% relative humidity.

27. The encapsulated microelectronic device of claim 1 further comprising a plastic substrate adjacent to the semiconductor substrate on a side opposite the microelectronic device.

28. The encapsulated microelectronic device of claim 27 further comprising at least one third barrier stack located between the plastic substrate and the semiconductor substrate, the at least one third barrier stack comprising at least one third barrier layer and at least one third polymer layer.

29. The encapsulated microelectronic device of claim 1 further comprising a lid adjacent to the at least one first barrier stack.

30. The encapsulated microelectronic device of claim 1 further comprising a second microelectronic device embedded in the semiconductor substrate.

31. An encapsulated microelectronic device comprising:
at least one first barrier stack comprising at least one first barrier layer and at least one first polymer layer;
a microelectronic device adjacent to the at least one first barrier stack, the microelectronic device being selected from integrated circuits, charge coupled devices, metal sensor pads, micro-disk lasers, electrochromic devices, photochromic devices, microelectromechanical systems and solar cells; and
at least one second barrier stack comprising at least one second barrier layer and at least one second polymer layer, wherein the at least one first barrier stack and the at least one second barrier stack encapsulate the microelectronic device.

32. The encapsulated microelectronic device of claim 31 further comprising a semiconductor substrate adjacent to the at least one first barrier stack on a side opposite the microelectronic device.

33. An encapsulated microelectronic device comprising:
a semiconductor substrate;
a microelectronic device embedded in the semiconductor substrate, the microelectronic device being selected from integrated circuits, charge coupled devices, metal sensor pads, micro-disk lasers, electrochromic devices, photochromic devices, microelectromechanical systems and solar cells; and
at least one first barrier stack comprising at least one first barrier layer and at least one first polymer layer, the at least one first barrier stack adjacent to the microelectronic device, wherein the at least one first barrier stack encapsulates the microelectronic device.

34. The encapsulated microelectronic device of claim 33 wherein the oxygen transmission rate through the at least one first barrier stack is less than 0.005 cc/m$^2$/day at 23° C. and 0% relative humidity.

35. The encapsulated microelectronic device of claim 33 wherein the oxygen transmission rate through the at least one first barrier stack is less than 0.005 cc/m$^2$/day at 38° C. and 90% relative humidity.

36. The encapsulated microelectronic device of claim 33 wherein the water vapor transmission rate through the at least one first barrier stack is less than 0.005 gm/m$^2$/day at 38° C. and 100% relative humidity.

37. The encapsulated microelectronic device of claim 1 wherein at least one of the at least one first barrier layers comprises a material selected from metal oxides, metal nitrides, metal carbides, metal oxynitrides, metal oxyborides, and combinations thereof.

38. The encapsulated microelectronic device of claim 37 wherein the metal oxides are selected from silicon oxide, aluminum oxide, titanium oxide, indium oxide, tin oxide, indium tin oxide, tantalum oxide, zirconium oxide, niobium oxide, and combinations thereof.

39. The encapsulated microelectronic device of claim 37 wherein the metal nitrides are selected from aluminum nitride, silicon nitride, boron nitride, and combinations thereof.

40. The encapsulated microelectronic device of claim 37 wherein the metal oxynitrides are selected from aluminum oxynitride, silicon oxynitride, boron oxynitride, and combinations thereof.

41. The encapsulated microelectronic device of claim 33 wherein at least one of the at least one first barrier layers is selected from opaque metals, opaque polymers, opaque ceramics, and opaque cermets.

42. The encapsulated microelectronic device of claim 33 wherein at least one of the at least one first polymer layers comprises an acrylate-containing polymer.

43. The encapsulated microelectronic device of claim 33 wherein the at least one first barrier layer comprises two barrier layers.

44. The encapsulated microelectronic device of claim 33 wherein the two barrier layers are made of the same barrier material.

45. The encapsulated microelectronic device of claim 33 wherein the two barrier layers are made of different barrier materials.

46. An encapsulated microelectronic device comprising:
   a semiconductor substrate;
   a microelectronic device adjacent to the semiconductor substrate, the microelectronic device being selected from integrated circuits, charge coupled devices, metal sensor pads, micro-disk lasers, electrochromic devices, photochromic devices, microelectromechanical systems and solar cells; and
   at least one first barrier stack comprising at least one first barrier layer and at least one first polymer layer, the at least one first barrier stack adjacent to the microelectronic device, wherein the at least one first barrier stack encapsulates the microelectronic device, and wherein the oxygen transmission rate through the at least one first barrier stack is less than 0.005 cc/m$^2$/day at 23° C. and 0% relative humidity.

47. The encapsulated microelectronic device of claim 46 wherein the oxygen transmission rate through the at least one first barrier stack is less than 0.005 cc/m$^2$/day at 38° C. and 90% relative humidity.

48. The encapsulated microelectronic device of claim 46 wherein the water vapor transmission rate through the at least one first barrier stack is less than 0.005 gm/m$^2$/day at 38° C. and 100% relative humidity.

49. The encapsulated microelectronic device of claim 46 wherein at least one of the at least one first barrier layers comprises a material selected from metal oxides, metal nitrides, metal carbides, metal oxynitrides, metal oxyborides, and combinations thereof.

50. The encapsulated microelectronic device of claim 49 wherein the metal oxides are selected from silicon oxide, aluminum oxide, titanium oxide, indium oxide, tin oxide, indium tin oxide, tantalum oxide, zirconium oxide, niobium oxide, and combinations thereof.

51. The encapsulated microelectronic device of claim 49 wherein the metal nitrides are selected from aluminum nitride, silicon nitride, boron nitride, and combinations thereof.

52. The encapsulated microelectronic device of claim 49 wherein the metal oxynitrides are selected from aluminum oxynitride, silicon oxynitride, boron oxynitride, and combinations thereof.

53. The encapsulated microelectronic device of claim 46 wherein at least one of the at least one first barrier layers is selected from opaque metals, opaque polymers, opaque ceramics, and opaque cermets.

54. The encapsulated microelectronic device of claim 46 wherein at least one of the at least one first polymer layers comprises an acrylate-containing polymer.

55. The encapsulated microelectronic device of claim 46 wherein the at least one first barrier layer comprises two barrier layers.

56. The encapsulated microelectronic device of claim 46 wherein the two barrier layers are made of the same barrier material.

* * * * *

UNITED STATES PATENT AND TRADEMARK OFFICE
CERTIFICATE OF CORRECTION

PATENT NO. : 6,548,912 B1
DATED : April 15, 2003
INVENTOR(S) : Graff et al.

It is certified that error appears in the above-identified patent and that said Letters Patent is hereby corrected as shown below:

Column 7,
Line 38, "polymers, or cernets." should be -- polymers, or cermets. --;
Line 48, "encapsulationibarrier stacks" should be -- encapsulation/barrier stacks --;
Line 53, "to perfonn antireflection" should be -- to perform antireflection --.

Signed and Sealed this

Twenty-sixth Day of August, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,548,912 B1
DATED : April 15, 2003
INVENTOR(S) : Graff et al.

It is certified that error appears in the above-identified patent and that said Letters Patent is hereby corrected as shown below:

<u>Column 14,</u>
Line 35, add the following claims:
57. The encapsulated microelectronic device of claim 46 wherein the two barrier layers are made of different barrier materials.
58. The encapsulated microelectronic device of claim 1 wherein the oxygen transmission rate through the at least one first barrier stack is less than 0.005 cc/m2/day at 38°C and 90% relative humidity.
59. The encapsulated microelectronic device of claim 1 further comprising an overcoat layer adjacent to the at least one first barrier stack on a side opposite the microelectronic device.
60. The encapsulated microelectronic device of claim 1 wherein the overcoat layer is selected from organic layers, inorganic layers, planarizing layers, transparent conductors, antireflective coatings, or combinations thereof.

Signed and Sealed this

Tenth Day of August, 2004

JON W. DUDAS
*Acting Director of the United States Patent and Trademark Office*